US010321554B2

(12) United States Patent
Asao et al.

(10) Patent No.: US 10,321,554 B2
(45) Date of Patent: Jun. 11, 2019

(54) ELECTRONIC CONTROL UNIT

(71) Applicant: Mitsubishi Electric Corporation, Tokyo (JP)

(72) Inventors: Yoshihito Asao, Tokyo (JP); Akihiko Mori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/580,148

(22) PCT Filed: Oct. 5, 2015

(86) PCT No.: PCT/JP2015/078150
§ 371 (c)(1),
(2) Date: Dec. 6, 2017

(87) PCT Pub. No.: WO2017/060944
PCT Pub. Date: Apr. 13, 2017

(65) Prior Publication Data
US 2018/0206327 A1    Jul. 19, 2018

(51) Int. Cl.
H05K 1/02       (2006.01)
H01L 23/36      (2006.01)
H05K 1/18       (2006.01)

(52) U.S. Cl.
CPC .......... H05K 1/0203 (2013.01); H01L 23/36 (2013.01); H05K 1/181 (2013.01);
(Continued)

(58) Field of Classification Search
CPC .......... H05K 7/20427; H05K 7/20436; H05K 1/181; H05K 1/0203; H01L 23/367
(Continued)

(56) References Cited

U.S. PATENT DOCUMENTS 6,775,141 B2 * 8/2004 Yoshida ............... H01L 23/42
257/707
2006/0096299 A1    5/2006 Mamitsu et al.
(Continued)

FOREIGN PATENT DOCUMENTS

JP    2006-165534 A    6/2006
JP    2014-041953 A    3/2014
JP    2014-154745 A    8/2014

OTHER PUBLICATIONS

International Search Report for PCT/JP2015/078150 dated Dec. 15, 2015 [PCT/ISA/210].
(Continued)

*Primary Examiner* — Mukundbhai G Patel
(74) *Attorney, Agent, or Firm* — Sughrue Mion, PLLC; Richard C. Turner

(57) ABSTRACT

The shape of an abutting portion where a heat sink and an electronic component or the heat sink and a connection wire abut against each other, through the intermediary of an intermediate member, is contrived so that there is provided an electronic control unit that can raise the easiness of production including the intermediate member, while securing the heat radiation performance. There is provided an electric power converter in which an intermediate member having an insulating property and a heat-conductive property is provided in a gap between a heat sink and a connection wire abutting portion or an electronic component, in which the top surface of a maximum heat generating component is a plane, and in which the portion, of the heat sink, that faces the top surface of the maximum heat generating component is part of a basic plane.

9 Claims, 4 Drawing Sheets

(52) U.S. Cl.
CPC ............... *H05K 2201/066* (2013.01); *H05K 2201/10053* (2013.01); *H05K 2201/10522* (2013.01)

(58) Field of Classification Search
USPC ........................................ 361/704
See application file for complete search history.

(56) References Cited

U.S. PATENT DOCUMENTS

| | | |
|---|---|---|
| 2012/0119347 A1 | 5/2012 | Mamitsu et al. |
| 2014/0225482 A1 | 8/2014 | Hara et al. |

OTHER PUBLICATIONS

Communication dated Mar. 27, 2018, from the Japanese Patent Office in counterpart application No. 2017-544075.

\* cited by examiner

ELECTRONIC CONTROL UNIT

CROSS REFERENCE TO RELATED APPLICATIONS

This application is a National Stage of International Application No. PCT/JP2015/078150, filed on Oct. 5, 2015, the contents of all of which are incorporated herein by reference in their entirety.

TECHNICAL FIELD

The present invention relates to an electronic control unit provided with electronic components and connection wires mounted on a substrate and a heat sink for radiating heat thereof.

BACKGROUND ART

With regard to such an electronic control unit as described above, the electronic control units disclosed in PLT-1 and PLT-2, described later, are known. In the technology disclosed in PLT-1, an upper-side heat sink and a lower-side heat sink, which each function also as the electrodes of a semiconductor chip, are soldered to the top surface and the bottom surface, respectively, of the semiconductor chip, and the upper-side and lower-side heat sinks are cooled by coolant.

In the technology disclosed in PLT-2, a protruding portion of a heat sink abuts against the top surface of a semiconductor chip, through the intermediary of an intermediate member having an insulating performance and a conductivity, and a protruding portion of the heat sink abuts against the top surface of a copper thin-film connection wire, through the intermediary of an intermediate member having an insulating property and a heat-conductive property.

CITATION LIST

Patent Literature

PLT 1: JP-A-2006-165534
PLT 1: JP-A-2014-154745

SUMMARY OF INVENTION

Technical Problem

In the technology disclosed in PLT-1, the upper-side heat sink and the lower-side heat sink are soldered to the top surface and the bottom surface, respectively, of the semiconductor chip; thus, this technology cannot be applied to a semiconductor chip and a connection wire mounted on a substrate. Moreover, in the technology disclosed in PLT-1, the heat sink, which functions also as the electrode of the semiconductor chip, is soldered to the top surface of the semiconductor chip; thus, this technology cannot be utilized when it is desired to secure an insulating performance between the semiconductor chip and the heat sink.

In the technology disclosed in PLT-2, protruding portions having different heights are provided in the heat sink, in order to make the respective protruding portions abut against the semiconductor chip and the connection wire whose protruding heights from the substrate are different from each other. Accordingly, the shape of the heat sink becomes complex, thereby raising the cost. Moreover, in the technology disclosed in PLT-2, in the case where a fluid intermediate member is coated on the front endface of the protruding portion of the heat sink and is cured, it is not easy that the fluid intermediate member is pooled at a uniform thickness on the front endface of the protruding portion and is cured.

Thus, there has been contrived the shape of an abutting portion where the heat sink and the electronic components or the heat sink and the connection wires abut against each other, through the intermediary of the intermediate member, so that there is provided an electronic control unit that can raise the easiness of production including the intermediate member, while securing the heat radiation performance.

Solution to Problem

A first electronic control unit according to the present invention includes:

two or more electronic components that each generate heat when energized;

connection wires that connect the two or more electronic components; and a heat sink for radiating heat of the two or more electronic components and the connection wires, wherein the two or more electronic components and the connection wires are mounted on a first substrate surface that is one of the sides of a substrate, wherein the heat sink is disposed spaced apart from a top surface, of each of the two or more electronic components and the connection wires, that is the surface opposite to the first substrate surface, wherein an intermediate member having an insulating property and a heat-conductive property is provided in a gap between the heat sink, and the two or more electronic components and connection wire abutting portions each of which is at least part of the connection wire in such a way as to abut against the heat sink, and the connection wire abutting portions or the two or more electronic components, and wherein the top surface of a maximum heat generating component, which is an electronic component that generates heat most among the two or more electronic components when energized, is a plane; a portion, of the heat sink, that faces the top surface of the maximum heat generating component is part of a basic plane, which is a plane of the heat sink.

A second electronic control unit according to the present invention includes:

two or more electronic components that each generate heat when energized;

connection wires that connect the two or more electronic components; and a heat sink for radiating heat of the two or more electronic components and the connection wires, wherein the two or more electronic components and the connection wires are mounted on a first substrate surface that is one of the sides of a substrate, wherein the heat sink is disposed spaced apart from a top surface, of each of the two or more electronic components and the connection wires, that is the surface opposite to the first substrate surface, wherein an intermediate member having an insulating property and a heat-conductive property is provided in a gap between the heat sink, and the two or more electronic components and connection wire abutting portions each of which is at least part of the connection wire in such a way as to abut against the heat sink, and the connection wire abutting portions or the two or more electronic components, wherein the portion, of the heat sink, that faces the top surface of the connection wire abutting portion is part of a basic plane, which is a plane of the heat sink, wherein the protruding height, toward the heat sink, of a maximum heat generating component that is an electronic component that generates heat most among the two or more electronic components when energized is larger than the protruding height of the connection wire abutting portion, and wherein the portion, of the heat sink, that faces the top surface of the maximum heat generating component is a recess portion that is depressed from the basic plane toward the side opposite to the side of the maximum heat generating component; the intermediate member is provided in the recess portion.

Advantage of Invention

Because in the first electronic control unit according to the present invention, the top surface of the maximum heat generating component that requires heat radiation most is a plane and the portion, of the heat sink, that faces the top surface of the maximum heat generating component is part of the basic plane, the shape of the heat sink can be simplified and the intermediate member that abuts against these planar portions can readily be formed. Furthermore, because the adhesiveness of the intermediate member can readily be secured, the heat radiation performance of the maximum heat generating component can be secured. As a result, by contriving the shape of the abutting portion, the easiness in producing the electronic control unit including the intermediate member can be raised, while the heat radiation performance is secured.

Because in the second electronic control unit according to the present invention, the portion, of the heat sink, that faces the connection wire abutting portion is part of the basic plane and the portion, of the heat sink, that faces the maximum heat generating component is the recess portion that is depressed from the basic plane, it is made possible to suppress the increase of the depressions and protrusions of the heat sink, in comparison with the case where the both portions are the recess portions or the protruding portions; thus, the easiness in producing the heat sink can be raised. The recess portion makes it possible to securely position the intermediate member against which the maximum heat generating component, which requires heat radiation most, abuts. Moreover, when the intermediate member having a fluidity is coated and cured on the recess portion, the intermediate member having a fluidity can be stored in the recess portion; therefore, it is made possible to readily form the intermediate member in the recess portion in such a way that the surface thereof becomes a uniform plane. Accordingly, because the adhesiveness of the intermediate member to the maximum heat generating component, which requires heat radiation most, is readily secured, the heat radiation performance can be secured. As a result, by contriving the shape of the abutting portion, the easiness in producing the electronic control unit including the intermediate member can be raised, while the heat radiation performance is secured.

DESCRIPTION OF EMBODIMENTS

1. Embodiment 1

Figure 1:
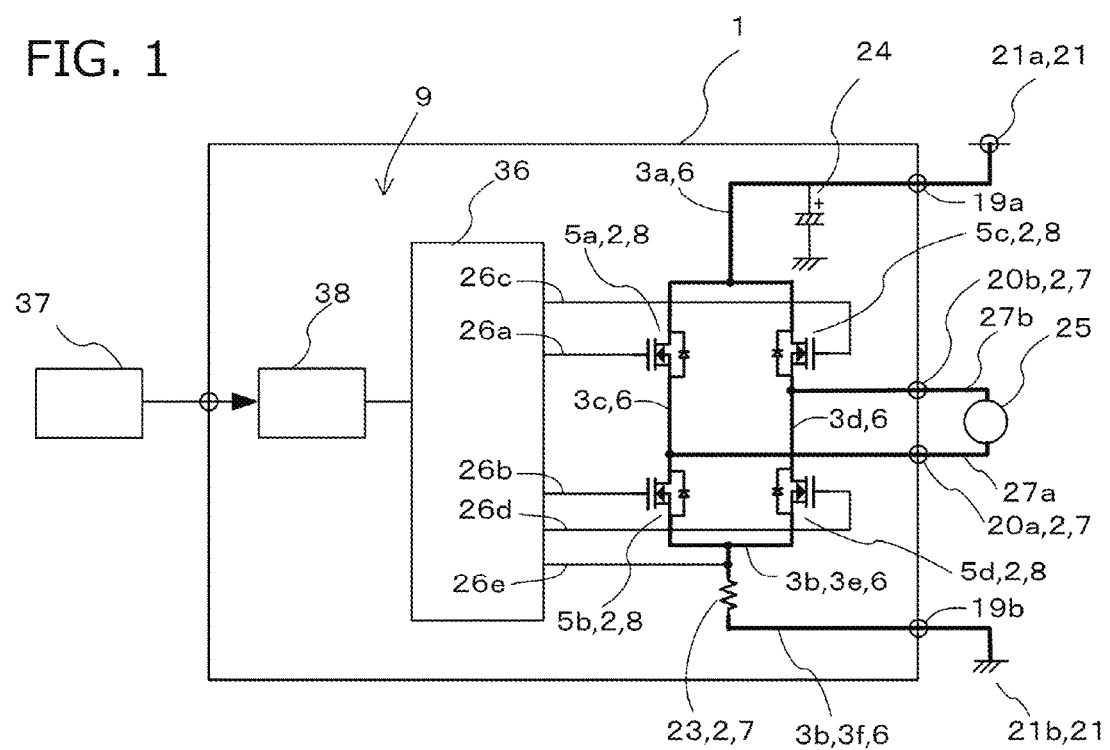
FIG. 1 is a circuit diagram of an electronic control unit according to Embodiment 1 of the present invention.
Figure 2:
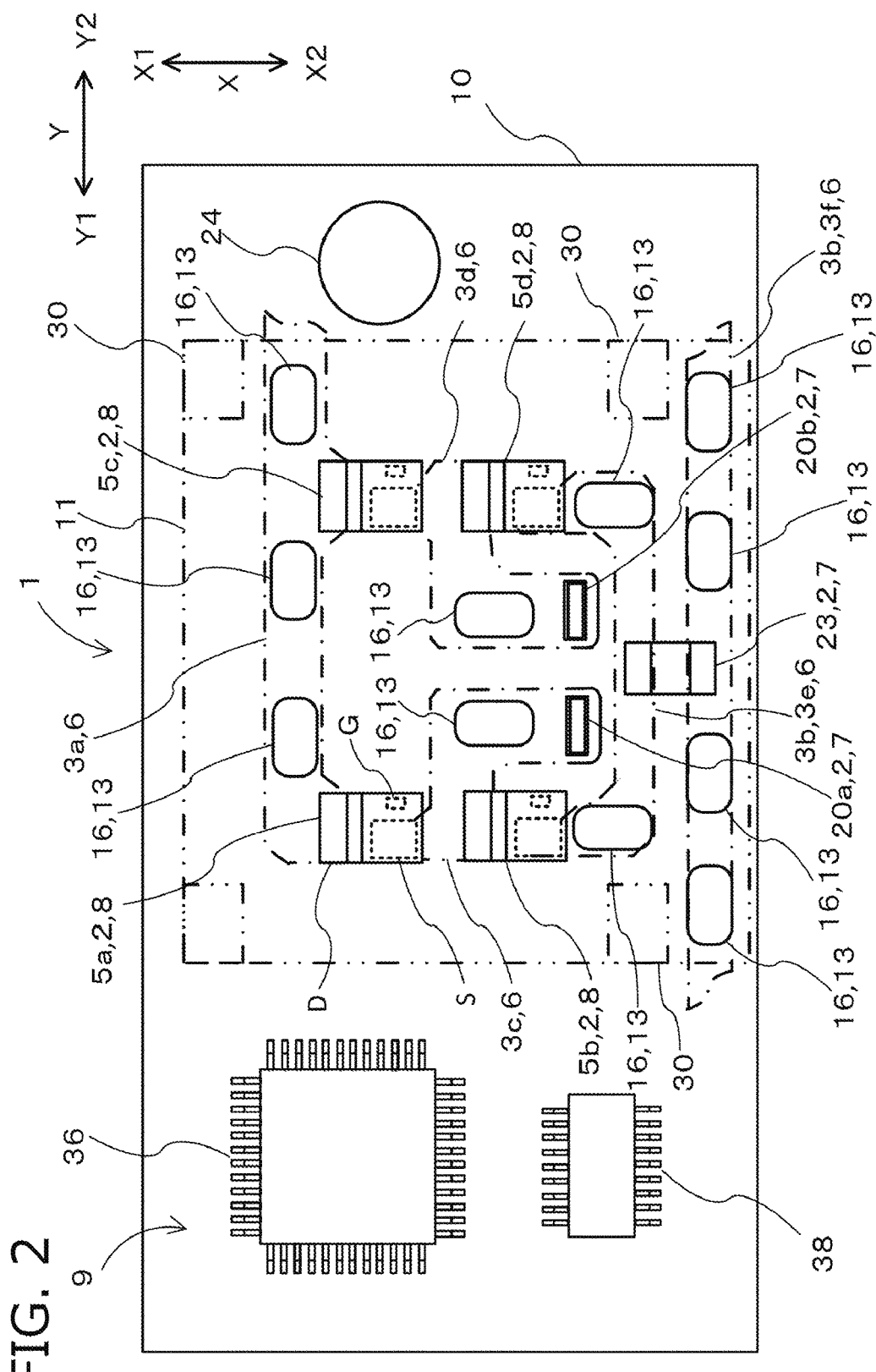
FIG. 2 is a plan view of principal parts of the electronic control unit according to Embodiment 1 of the present invention, when viewed from the top side.
Figure 3:
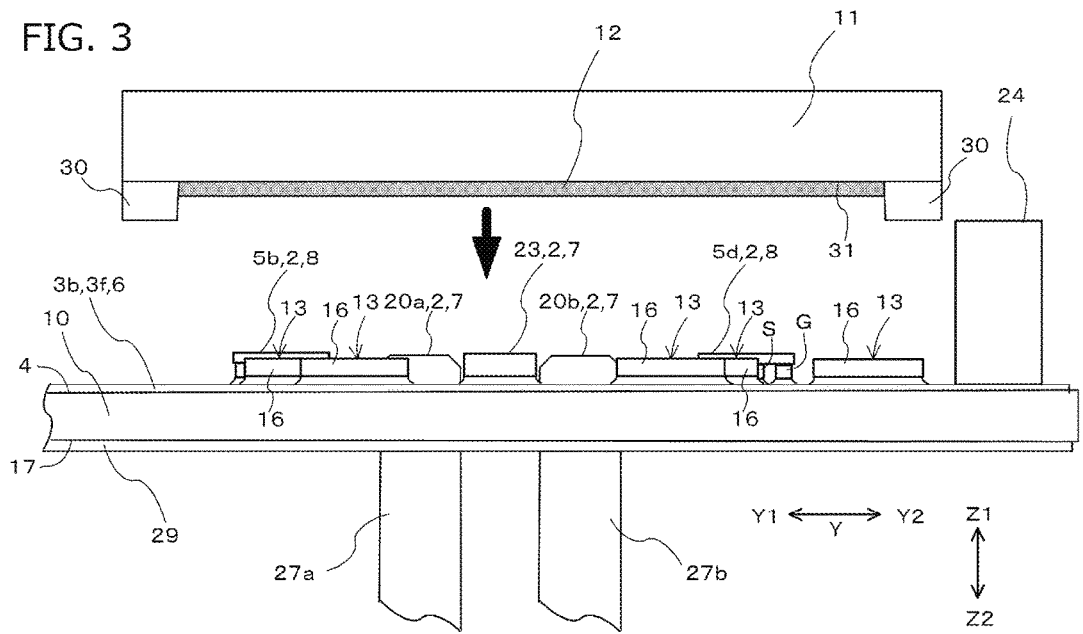
FIG. 3 is a side view of the principal parts of the electronic control unit, when a heat sink according to Embodiment 1 of the present invention is removed from a substrate.

An electronic control unit 1 according to Embodiment 1 will be explained with reference to drawings. FIG. 1 is a circuit diagram of an electronic control unit 1; FIG. 2 is a plan view of the electronic control unit 1, viewed through a heat sink 11 and an intermediate member 12 from a first substrate surface 4 (the upper side Z1); FIG. 3 is an exploded side view of the principal parts of the electronic control unit 1, viewed from a longitudinal direction first side X1, when the heat sink 11 is removed from a substrate 10 toward the upper side Z1.

The electronic control unit 1 is provided with two or more electronic components 2 (hereinafter, referred to as subject electronic components 2) that generate heat when energized, connection wires 6 (hereinafter, referred to as subject connection wires 6) for connecting the two or more subject electronic components 2, and a heat sink 11 for radiating heat of the two or more subject electronic components 2 and the subject connection wires 6. The two or more subject electronic components 2 and subject connection wires 6 are mounted on the first substrate surface 4, which is one of the sides of the substrate 10. In Embodiment 1, the electronic control unit 1 is a control apparatus for a motor 25.

1-1. The Circuit Configuration of the Electronic Control Unit 1

In Embodiment 1, as represented in FIG. 1, the electronic control unit 1 is a control apparatus for a motor 25. The electronic control unit 1 is provided with a bridge circuit including two or more switching devices that perform on/off-switching of electric-power supply from a power source 21 to the motor 25. In Embodiment 1, the motor 25 is a permanent-magnet DC commutator motor. For example, the motor 25 is a driving force source for vehicle apparatuses such as a power window and a power steering to be mounted in a vehicle; the rotation axle of the motor 25 is coupled with a gear mechanism or the like. In this case, the electronic control unit 1 is a vehicle electronic control unit mounted in a vehicle.

The bridge circuit is an H-bridge circuit having four switching devices 5a, 5b, 5c, and 5d. Specifically, two series circuits, in each of which two switching devices are connected in series with each other, are connected in parallel with each other between a positive-electrode connection wire 3a and a negative-electrode connection wire 3b. Intermediate connection wires 3c and 3d that each connect two switching devices in the respective series circuits are connected with respective motor connection terminals 20a and 20b.

The drain terminal of a first switching device 5a is connected with the positive-electrode connection wire 3a; the source terminal of the first switching device 5a is connected with the drain terminal of a second switching device 5*b*; the source terminal of the second switching device 5*b* is connected with the negative-electrode connection wire 3*b*. A first intermediate connection wire 3*c* for connecting the source terminal of the first switching device 5*a* with the drain terminal of the second switching device 5*b* is connected with a first motor connection terminal 20*a*. The drain terminal of a third switching device 5*c* is connected with the positive-electrode connection wire 3*a*; the source terminal of the third switching device 5*c* is connected with the drain terminal of a fourth switching device 5*d*; the source terminal of the fourth switching device 5*d* is connected with the negative-electrode connection wire 3*b*. A second intermediate connection wire 3*d* for connecting the source terminal of the third switching device 5*c* with the drain terminal of the fourth switching device 5*d* is connected with a second motor connection terminal 20*b*. The positive-electrode connection wire 3*a* is connected with a positive-electrode power source connection terminal 19*a* to be connected with a positive-electrode terminal 21*a* of the power source 21; the negative-electrode connection wire 3*b* is connected with a negative-electrode power source connection terminal 19*b* to be connected with a negative-electrode terminal 21*b* of the power source 21. The first motor connection terminal 20*a* is connected with a first terminal of the motor 25; the second motor connection terminal 20*b* is connected with a second terminal of the motor 25. In this example, the negative-electrode power source connection terminal 19*b* is connected with the ground connected with the negative-electrode terminal 21*b* of the power source 21.

As each of the switching devices 5*a* through 5*d*, a power MOSFET (Metal Oxide Semiconductor Field Effect Transistor) is utilized. A power MOSFET also has a function of a diode connected between the drain terminal and the source terminal in an anti-parallel manner. It may be allowed that as each of the switching devices 5*a* through 5*d*, another kind of switching device, such as an IGBT (Insulated Gate Bipolar Transistor) with which a free-wheel diode is connected in an anti-parallel manner, is utilized.

A shunt resistor 23 for detecting an electric current flowing in the coil of the motor 25 and the like is connected in series in a connection path that connects the positive-electrode power source connection terminal 19*a* with the negative-electrode power source connection terminal 19*b*. In Embodiment 1, the shunt resistor 23 is connected in series in the negative-electrode connection wire 3*b*. The negative-electrode connection wire 3*b* consists of a source terminal connection wire 3*e* that connects the source terminal of the second switching device 5*b* with the source terminal of the fourth switching device 5*d* and a negative-electrode wire 3*f* connected with the negative-electrode power source connection terminal 19*b*; the shunt resistor 23 is connected in series between the source terminal connection wire 3*e* and the negative-electrode wire 3*f*.

The electronic control unit 1 is provided with a smoothing capacitor 24 connected in series between the positive-electrode connection wire 3*a* and the negative-electrode connection wire 3*b* (in this example, the ground connected with the negative-electrode connection wire 3*b*). The smoothing capacitor 24 smoothes the DC power source voltage.

The electronic control unit 1 is provided with a control circuit 9 having a microcomputer 36, an input circuit 38, and the like. The respective gate terminals of the switching devices 5*a* through 5*d* are connected with the control circuit 9 by way of signal wires 26*a* through 26*d*; the control circuit 9 outputs signals for performing on/off-switching of the switching devices 5*a* through 5*d* so as to perform on/off-control of the switching devices 5*a* through 5*d*. The voltage across the shunt resistor 23 is inputted to the control circuit 9 by way of the signal wire 26*e*; the control circuit 9 detects an electric current flowing in the motor 25, based on the voltage across the shunt resistor 23. Various kinds of sensors 37 are connected with the input circuit 38 by way of signal wires; the input circuit 38 is provided with, for example, an A/D converter for inputting the output signals of the sensors 37 to the microcomputer 36.

When the motor 25 is made to output torque in a first rotation direction (referred to as "in the case of a forward rotation", hereinafter), the control circuit 9 turns on the first switching device 5*a* and the fourth switching device 5*d* and turns off the second switching device 5*b* and the third switching device 5*c*. When the motor 25 is made to output torque in a second rotation direction (referred to as "in the case of a backward rotation, hereinafter), which is the direction opposite to the first rotation direction, the control circuit 9 turns on the second switching device 5*b* and the third switching device 5*c* and turns off the first switching device 5*a* and the fourth switching device 5*d*. When the rotation of the motor 25 is braked, the control circuit 9 turns on the second switching device 5*b* and the fourth switching device 5*d* and turns off the first switching device 5*a* and the third switching device 5*c*.

The control circuit 9 changes respective On-duty ratios for the switching devices 5*a* through 5*d*, by means of PWM (Pulse Width Modulation) control. The electric current flowing in the motor 25 is changed in proportion to the On-duty ratio; then, in proportion to the electric current in the motor 25, the output torque of the motor 25 changes. The control circuit 9 compares a target current with the electric current in the motor 25, detected through the voltage across the shunt resistor 23, so as to perform current feedback control in which the respective On-duty ratios for the switching devices 5*a* through 5*d* to be turned on in the case of the forward rotation, the backward rotation, or braking are changed.

The heat generation amount in each of the switching devices 5*a* through 5*d* changes in proportion to the electric current flowing in the switching device. The heat generation amount in each of the switching devices 5*a* through 5*d* becomes maximum when the On-duty ratio is 100%. The heat generation amount in the shunt resistor 23 also changes in proportion to the electric currents flowing in the switching devices 5*a* through 5*d* and the motor 25.

In order to make the motor 25 generate driving force, the respective electric currents in the connection wires 3*a* through 3*f* for connecting the power source connection terminals 19*a* and 19*b*, the two or more switching devices 5*a* through 5*d*, and the motor connection terminals 20*a* and 20*b* become drastically larger than the respective currents in the signal wires 26*a* through 26*e* and hence the respective heat generation amounts in the connection wires 3*a* through 3*f* become drastically large. Therefore, in FIG. 1, the thicknesses of the connection wires 3*a* through 3*f* and the shunt resistor 23 are larger than those of the signal wires 26*a* through 26*e*. Practically, the cross-sectional areas of the connection wires 3*a* through 3*f* are larger than those of the signal wires 26*a* through 26*e*.

Accordingly, the electric currents flowing in the power-system circuit components such as the switching devices 5*a* through 5*d*, the shunt resistor 23, and the connection wires 3*a* through 3*f* and the heat generation amounts therein are drastically larger than the electric currents flowing in the control-system circuit components such as the control circuit 9 and the signal wires 26*a* through 26*e* and the heat generation amounts therein. Thus, in order to exert the function of the electronic control unit 1, it is required to appropriately design the heat-radiation mechanism for the power-system circuit components.

1-2. The Arrangement Configuration of the Electronic Control Unit 1

As described above, the electronic control unit 1 is provided with the two or more subject electronic components 2 that generate heat when energized, the subject connection wires 6 for connecting the two or more subject electronic components 2, and a heat sink 11 for radiating heat of the two or more subject electronic components 2 and the subject connection wires 6. The two or more subject electronic components 2 and subject connection wires 6 are mounted on the first substrate surface 4, which is one of the sides of the substrate 10.

The heat sink 11 is disposed spaced a gap apart from the top surfaces, of the two or more subject electronic components 2 and subject connection wires 6, that are sides opposite to the first substrate surface 4. That is to say, the heat sink 11 is disposed at the upper side Z1 of the two or more subject electronic components 2 and subject connection wires 6 in such a way that there exist respective gaps between the heat sink 11 and the two or more subject electronic components 2 and respective gaps between the heat sink 11 and the two or more subject connection wires 6. An intermediate member 12 having an insulating property and a heat-conductive property is provided in a gap between the heat sink 11 and connection wire abutting portions 13, each of which is at least part of the subject connection wire 6, and the two or more subject electronic components 2 in such a way as to abut against the heat sink 11 and the connection wire abutting portions 13 or the two or more subject electronic components 2. The top surface of a maximum heat generating component 8, which is an electronic component that generates heat most among the two or more subject electronic components 2 when energized, is a plane; the portion, of the heat sink 11, that faces the top surface of the maximum heat generating component 8 is part of a basic plane 31, which is a plane of the heat sink 11. The heat generation amount of the maximum heat generating component 8 being energized is more than any one of the heat generation amounts of the two or more subject electronic components 2. The heat generation (heat generation amount) of the subject connection wire 6 being energized is smaller than the heat generation (heat generation amount) of the maximum heat generating component 8 being energized.

In this configuration, heat generated by the two or more subject electronic components 2 and subject connection wires 6 is transferred to the intermediate member 12 that abuts against the respective top surfaces thereof and that has a heat-conductive property; then, the heat is transferred to the heat sink 11 that abuts against the upper side of the intermediate member 12, so that the heat can be radiated from the heat sink 11. Accordingly, heat generated by the two or more subject electronic components 2 and subject connection wires 6 can effectively be radiated by a single heat sink 11. Because the intermediate member 12 has an insulating property, the insulating property between the heat sink 11, and the two or more subject electronic components 2 and subject connection wires 6 can be secured. Because the top surface of the maximum heat generating component 8 that requires heat radiation most is a plane and the portion, of the heat sink 11, that faces the top surface of the maximum heat generating component 8 is part of the basic plane 31, the shape of the heat sink 11 can be simplified and the intermediate member 12 that abuts against these planar portions can readily be formed. Furthermore, because the adhesiveness of the intermediate member 12 can readily be secured, the heat radiation performance of the maximum heat generating component 8 can be secured.

In Embodiment 1, the two or more subject electronic components 2, heat of which is radiated through the heat sink 11, include the two or more switching devices (in this example, the four switching devices 5a through 5d) that each perform on/off-switching of electric-power supply from the power source 21 to the motor 25. The subject electronic components 2 include the shunt resistor 23 and the motor connection terminals 20a and 20b in addition to the two or more switching devices 5a through 5d. The maximum heat generating components 8 are two or more switching devices. The low-heat generating components 7, which are electronic components that each generate, when energized, lower heat than the maximum heat generating components 8 each generate are the shunt resistor 23 and the motor connection terminals 20a and 20b.

The subject connection wires 6, heat of which is radiated through the heat sink 11, include the two or more connection wires (in this example, the six connection wires 3a through 3f) that connect the power source connection terminals 19a and 19b, the two or more switching devices (in this example, the shunt resistor 23 in addition to the four switching devices 5a through 5d), and the motor connection terminals 20a and 20b. Specifically, the subject connection wires 6 include the positive-electrode connection wire 3a, the negative-electrode connection wire 3b, the first intermediate connection wire 3c, the second intermediate connection wire 3d, and the source terminal connection wire 3e.

As illustrated in the plan view of FIG. 2 and in the side view of FIG. 3, the substrate 10 is formed in the shape of a flat plate (in this example, in the shape of a rectangular flat plate) made of a non-conductive material such as a glass fiber or an epoxy resin. One of the sides of the substrate 10 is the first substrate surface 4 and the side opposite to the first substrate surface 4 is a second substrate surface 17. Each of the first substrate surface 4 and the second substrate surface 17 is a plane. Wiring strip conductors of the power-system connection wires 3a through 3f and a connection wire 29, the heat generation amounts of which are relatively large, are formed on the first substrate surface 4 and the second substrate surface 17, respectively; wiring strip conductors of the signal wires 26a through 26e, the heat generation amounts of which are relatively small, are formed on an inner layer of the substrate 10 (unillustrated).

The two or more switching devices 5a through 5d, the shunt resistor 23, and the two or more connection wires 3a through 3f are surface-mounted on the first substrate surface 4 of the substrate 10. With regard to the heat sink 11 and the circuit components such as the switching devices 5a through 5d, the shunt resistor 23, and the connection wires 3a through 3f, mounted on the first substrate surface 4, each of the surfaces thereof on the first substrate surface 4 is defined as a bottom surface; each of the surfaces thereof facing opposite to the first substrate surface 4 is defined as a top surface; each of the sides thereof at the first substrate surface 4 is defined as a lower side Z2; each of the sides thereof at the side opposite to the first substrate surface 4 is defined as an upper side Z1. The normal line direction of the first substrate surface 4 is the upper direction; the direction opposite to the normal line direction of the first substrate surface 4 is the lower direction. The "upper" and the "lower" described here are not the "upper" and the "lower" in the vertical direction.

A predetermined direction that is parallel to the first substrate surface 4 is defined as a longitudinal direction X; the direction that is parallel to the first substrate surface 4 and is perpendicular to the longitudinal direction X is defined as a transverse direction Y. One side of the longitudinal direction X is defined as a longitudinal direction first side X1; the other side, which is opposite side of the longitudinal direction first side X1 in the longitudinal direction X, is defined as a longitudinal direction second side X2. One side of the transverse direction Y is defined as a transverse direction first side Y1; the other side, which is opposite side of the transverse direction first side Y1 in the transverse direction Y, is defined as a transverse direction second side Y2.

Each of the connection wires 3a through 3f is formed in the shape of a flat plate made of copper; the bottom surface of the copper flat plate (or the copper foil) is bonded to the first substrate surface 4 of the substrate 10 by use of an adhesive or the like. Accordingly, the top and bottom surfaces of each of the connection wires 3a through 3f are planes parallel to the first substrate surface 4 of the substrate 10. The width and the thickness of each of the connection wires 3a through 3f are set in accordance with the amount of an electric current that flows therein. The respective thicknesses of the connection wires 3a through 3f are equal to one another; the respective protruding heights, from the first substrate surface 4, of the connection wires 3a through 3f are equal to one another. The connection wires 3a through 3f may be formed on the first substrate surface 4, for example, through the subtractive method, the additive method, or the like.

The source terminal S and the drain terminal D of each of the switching devices 5a through 5d are soldered to the respective top surfaces of the two corresponding connection wires and are arranged across the two corresponding connection wires, at the upper side Z1 thereof. The switching devices 5a through 5d protrude toward the upper side Z1 from the respective connection wires 3a through 3f.

Describing in detail, the drain terminal D is formed in the shape of a rectangular flat plate protruding sideward from each of the switching devices 5a through 5d and is connected to the top surface of the connection wire by means of soldering. The source terminal S is formed in the shape of a rectangular flat plate having a relatively large area, at the lower side Z2 of each of the switching devices 5a through 5d, and is connected to the top surface of the connection wire by means of soldering. The gate terminal G of each of the switching devices 5a through 5d is formed in the shape of a rectangular flat plate having a relatively small area, at the lower side Z2 of each of the switching devices 5a through 5d, and is connected, by means of soldering, to a top-surface exposed portion of the wiring strip conductor (unillustrated) of each of the signal wires 26a through 26e that are formed in the inner layer of the substrate 10.

Each of the switching devices 5a through 5d is formed in the shape of a rectangular flat plate (alternatively, in the shape of a chip or a rectangular parallelepiped); switching devices having one and the same shape are utilized. The top surface of each of the switching devices 5a through 5d is a rectangular plane parallel to the first substrate surface 4 of the substrate 10.

The drain terminal D of the first switching device 5a is soldered to the top surface of the positive-electrode connection wire 3a; the source terminal S of the first switching device 5a is soldered to the top surface of the first intermediate connection wire 3c. The drain terminal D of the second switching device 5b is connected to the top surface of the first intermediate connection wire 3c; the source terminal S of the second switching device 5b is soldered to the top surface of the source terminal connection wire 3e. The drain terminal D of the third switching device 5c is soldered to the top surface of the positive-electrode connection wire 3a; the source terminal S of the third switching device 5c is soldered to the top surface of the second intermediate connection wire 3d. The drain terminal D of the fourth switching device 5d is connected to the top surface of the second intermediate connection wire 3d; the source terminal S of the fourth switching device 5d is soldered to the top surface of the source terminal connection wire 3e.

The two terminals of the shunt resistor 23 are soldered to the respective top surfaces of the source terminal connection wire 3e and the negative-electrode connection wire 3b and are arranged across the source terminal connection wire 3e and the negative-electrode connection wire 3b, at the upper side Z1 thereof. Accordingly, the shunt resistor 23 protrudes toward the upper side Z1 from the connection wires 3a through 3f. The shunt resistor 23 is formed in the shape of a rectangular flat plate (alternatively, in the shape of a chip or a rectangular parallelepiped). Each of the top and bottom surfaces of the shunt resistor 23 is a rectangular plane parallel to the first substrate surface 4 of the substrate 10.

A first motor connection wire 27a and a second motor connection wire 27b that extend from the motor 25 are connected with the first and second motor connection terminals 20a and 20b, respectively. The first and second motor connection terminals 20a and 20b are formed on the first and second intermediate connection wires 3c and 3d, respectively. Specifically, the first and second intermediate connection wires 3c and 3d have respective through-holes through which the first and second motor connection wires 27a and 27b pass and respective fixing portions to which the first and second motor connection wires 27a and 27b inserted into the through-holes from the lower side Z2 are fixed; the respective through-holes and the respective fixing portions configure the first and second motor connection terminals 20a and 20b. The substrate 10 is provided with the through-holes through which the first and second motor connection wires 27a and 27b pass. Each of the first and second motor connection wires 27a and 27b is formed in the shape of a rod whose cross section is a rectangle. The front-end portions of the first and second motor connection wires 27a and 27b inserted into the through-holes from the second substrate surface 17 of the substrate 10 protrude more toward the upper side Z1 than the connection wires 3a through 3f; these front-end protruding portions also configure part of the first and second motor connection terminals 20a and 20b.

The two or more switching devices are arranged spaced apart from one another in the manner of a length-and-breadth matrix. In this example, two of the switching devices are arranged in a row in such a way as to be spaced apart from each other in the longitudinal direction X, and two of the switching devices are arranged in a row in such a way as to be spaced apart from each other in the transverse direction Y. Each of the two or more switching devices is oriented in such a way that the drain terminal D is disposed at the longitudinal direction first side X1 and the source terminal S is disposed at the longitudinal direction second side X2. In the column, at the transverse direction first side Y1, of the length-and-breadth matrix arrangement, the first switching device 5a and the second switching device 5b, which configure a first series circuit, are adjacently arranged in that order from the longitudinal direction first side X1. In the column, at the transverse direction second side Y2, of the length-and-breadth matrix arrangement, the third switching device 5c and the fourth switching device 5d, which configure a second series circuit, are adjacently arranged in that order from the longitudinal direction first side X1. The first series circuit and the second series circuit are arranged spaced apart from each other by a gap in the transverse direction Y for arranging the first and second motor connection terminals 20a and 20b.

The positive-electrode connection wire 3a extends in the transverse direction Y at the longitudinal direction first side X1 of the first and third switching devices 5a and 5c so as to connect the drain terminal D of the first switching device 5a with the drain terminal D of the third switching device 5c; the positive-electrode connection wire 3a further extends toward the transverse direction second side Y2 and then is connected with the positive-electrode power source connection terminal 19a (partially unillustrated). The first intermediate connection wire 3c extends, in the longitudinal direction X, between the first and second switching devices 5a and 5b so as to connect the source terminal S of the first switching device 5a with the drain terminal D of the second switching device 5b; the first intermediate connection wire 3c further extends toward the transverse direction second side Y2 and then extends toward the longitudinal direction second side X2 in an L-shaped manner so as to be connected with the first motor connection terminal 20a. The second intermediate connection wire 3d extends, in the longitudinal direction X, between the third and fourth switching devices 5c and 5d so as to connect the source terminal S of the third switching device 5c with the drain terminal D of the fourth switching device 5d; the second intermediate connection wire 3d further extends toward the transverse direction first side Y1 and then extends toward the longitudinal direction second side X2 in an L-shaped manner so as to be connected with the second motor connection terminal 20b.

The source terminal connection wire 3e extends in the transverse direction Y at the longitudinal direction second side X2 of the second and fourth switching devices 5b and 5d so as to connect the source terminal S of the second switching device 5b with the source terminal S of the fourth switching device 5d. The middle portion, in the transverse direction Y, of the source terminal connection wire 3e is connected with the first terminal of the shunt resistor 23. The negative-electrode wire 3f is disposed at the longitudinal direction second side X2 of the source terminal connection wire 3e in such a way as to be spaced apart from the source terminal connection wire 3e and extends in the transverse direction Y. The middle portion, in the transverse direction Y, of the negative-electrode wire 3f is connected with the second terminal of the shunt resistor 23. The negative-electrode wire 3f further extends toward the transverse direction second side Y2 so as to be connected with the negative-electrode power source connection terminal 19b (partially unillustrated). The shunt resistor 23 is disposed spaced evenly apart from the second switching device 5b and the fourth switching device 5d.

As described above, the arrangement area of the two or more subject electronic components 2 and subject connection wires 6, which are the radiation subjects of the heat sink 11, is a rectangular area having sides parallel to the longitudinal direction X or the transverse direction Y in a plan view. The heat sink 11 is formed in such a way as to cover the upper side Z1 of the rectangular arrangement area of these radiation subject components. In Embodiment 1, the heat sink 11 is formed in the shape of a rectangular parallelepiped having sides parallel to the longitudinal direction X or the transverse direction Y. The arrangement area of the heat sink 11 is a rectangular area that is wider in a plan view than the arrangement area of the radiation subject components.

In Embodiment 1, in each of the connection wire abutting portions 13 of the subject connection wires 6, there is provided a heat-transfer protruding portion 16 that is made of a material of the same kind as the subject connection wire 6 or a material having the same heat-conductive property as the subject connection wire 6 and extends toward the heat sink 11; the heat-transfer protruding portion 16 abuts against the intermediate member 12. That is to say, the connection wire abutting portion 13 abuts against the intermediate member 12 through the intermediary of the heat-transfer protruding portion 16.

The heat-transfer protruding portion 16 is formed in the shape of a rounded-rectangle flat plate (or in the shape of a column whose cross-sectional shape is a rounded rectangle). The top and bottom surfaces of the heat-transfer protruding portion 16 are a rounded-rectangle plane parallel to the first substrate surface 4 of the substrate 10. The heat-transfer protruding portion 16 is made of copper, as is the case with each of the connection wires 3a through 3f. The heat-transfer protruding portion 16 may be made of a metal material such as aluminum having a heat-conductive property substantially equal to that of each of the connection wires 3a through 3f. The bottom surface of the heat-transfer protruding portion 16 is soldered with the top surface of corresponding each of the connection wires 3a through 3f. In order to facilitate the soldering, tinning processing may be applied to the surface of the heat-transfer protruding portion 16. Solder-resist processing is not applied to the top surface of the connection wire abutting portion 13 of each of the connection wires 3a through 3f; copper is exposed at the top surface of the connection wire abutting portion 13 and hence soldering can be performed. Solder-resist processing is applied to the top surface of each of the connection wires 3a through 3f, excluding the connection wire abutting portion 13 thereof.

At least one of the heat-transfer protruding portions 16 is provided in each of the two or more connection wires 3a through 3f. In each of the connection wires 3a through 3f, there are provided the heat-transfer protruding portions 16, the number of which corresponds to the length of corresponding each of the two or more connection wires 3a through 3f. Accordingly, the heat generated by each of the connection wires 3a through 3f, the heat generation amounts of which change depending on the lengths thereof, can appropriately be radiated. Specifically, in the positive-electrode connection wire 3a, there are provided three of the heat-transfer protruding portions 16 in a row in the transverse direction Y in such a way as to be spaced apart from one another; in the negative-electrode wire 3f, there are provided four of the heat-transfer protruding portions 16 in a row in the transverse direction Y in such a way as to be spaced apart from one another; in the first intermediate connection wire 3c, there is provided one of the heat-transfer protruding portions 16; in the second intermediate connection wire 3d, there is provided one of the heat-transfer protruding portions 16; in the source terminal connection wire 3e, there are provided two of the heat-transfer protruding portions 16 in the transverse direction Y. The respective thicknesses of the heat-transfer protruding portions 16 are equal to one another; the respective protruding heights at the upper side Z1, from the first substrate surface 4, of the heat-transfer protruding portions 16 are equal to one another.

By providing the heat-transfer protruding portion 16 in the subject connection wires 6 (the connection wire abutting portion 13), the gap between the subject connection wire 6 and the heat sink 11 can appropriately be narrowed. Accordingly, it is facilitated to make each of the connection wires 3a through 3f contact with the intermediate member 12 through the intermediary of the heat-transfer protruding portion 16 and hence the heat radiation performances of the connection wires 3a through 3f can be raised. By providing the heat-transfer protruding portions 16, the respective resistance values of the connection wires 3a through 3f are decreased and hence the power loss caused by the connection wires 3a through 3f can be reduced.

The facing surface of the portion, of the heat sink 11, that faces the respective top surfaces of the connection wire abutting portion 13 and each of the two or more subject electronic components 2 is part of the basic plane 31, which is a plane of the heat sink 11. The intermediate member 12 is formed in the shape of a single sheet that abuts against the basic plane 31 of the heat sink 11 and has an elasticity.

This configuration makes it possible to realize a simple structure by merely inserting the sheet-shaped intermediate member 12, which has an elasticity in addition to an insulating property and a heat-conductive property, between the basic plane 31 of the heat sink 11 and either the connection wire abutting portion 13 or each of the two or more subject electronic components 2. The intermediate member 12 has an elasticity; therefore, even when the respective protruding heights of the connection wire abutting portion 13 and the two or more subject electronic components 2 are different from one another, the thickness of the intermediate member 12 changes and hence the differences among the protruding heights can be absorbed. Moreover, even when the heat sink 11 is made of, for example, die-cast aluminum and has some depressions and protrusions on the surface thereof, the depressions and protrusions can be absorbed by the deformation of the intermediate member 12. Accordingly, it is made possible to make the intermediate member 12 abut against the connection wire abutting portion 13, each of the two or more subject electronic components 2, and the heat sink 11; thus, the heat radiation performance can be raised. Furthermore, the insertion of the intermediate member 12 having an elasticity makes it possible to raise the adhesiveness among the intermediate member 12, each of the two or more subject electronic components 2, and the heat sink 11; thus, the heat-conductive property can securely be obtained.

In Embodiment 1, as the intermediate member 12, a silicone rubber formed in the shape of a sheet having a predetermined thickness is utilized; the intermediate member 12 has an insulating property, a heat-conductive property, and an elasticity. The intermediate member 12 may be a resin material (e.g., an epoxy resin or a silicone rubber), having an elasticity, that is coated on the basic plane 31 of the heat sink 11 and solidifies in the shape of a sheet. The coating is readily performed because it is a simple coating of a predetermined thickness on the basic plane 31. When it is coated on the heat sink 11, the intermediate member 12 having a fluidity is coated and solidified on the heat sink 11 while the heat sink 11 is disposed in such a way that the normal direction of the basic plane 31 is oriented upward in the vertical direction.

In Embodiment 1, respective four leg portions 30 protruding toward the substrate 10 (toward the lower side Z2) are provided in the vicinities of the four corners of the basic plane 31 of the rectangular heat sink 11. The bottom face of the leg portion 30 abuts against the first substrate surface 4 and is fixed to the substrate 10. The gap between the basic plane 31 of the heat sink 11 and the first substrate surface 4 is adjusted by the lengths of the four leg portions 30. The basic plane 31 of the heat sink 11 excluding the leg portions 30 at the four corners is a rectangular plane parallel to the first substrate surface 4. The intermediate member 12 is formed in the shape of a single sheet having the shape of a rectangular plane corresponding to the basic plane 31 and abuts against the basic plane 31.

The respective protruding heights, from the first substrate surface 4, of the two or more subject electronic components 2 (in this example, the switching devices, the motor connection terminals 20a and 20b, and the shunt resistor 23) are larger than the respective protruding heights, from the first substrate surface 4, of the connection wire abutting portions 13. The thickness of the portion, of the intermediate member 12, that disposed in the gap between the heat sink 11 and each of the two or more subject electronic components 2 is smaller than the thickness of the portion, of the intermediate member 12, that is disposed in the gap between the heat sink 11 and the connection wire abutting portion 13.

In this configuration, the thickness of the intermediate member 12 corresponding to each of the two or more subject electronic components 2 is smaller than the thickness of the intermediate member 12 corresponding to the connection wire abutting portion 13; thus, the heat-conductive property of the intermediate member 12 is further raised and hence the heat radiation performances of the two or more subject electronic components 2 can further be raised.

In Embodiment 1, the intermediate member 12 is formed in the shape of a single sheet having an elasticity; thus, when inserted between the heat sink 11, and the two or more subject electronic components 2 and the connection wire abutting portion 13, the intermediate member 12 is deformed due to the elasticity, and the thickness of the intermediate member 12 corresponding to each of the two or more subject electronic components 2 becomes smaller than the thickness of the intermediate member 12 corresponding to the connection wire abutting portion 13. Moreover, it is made possible to further raise the adhesiveness among the intermediate member 12, each of the two or more subject electronic components 2, and the heat sink 11; thus, the heat-conductive property can securely be obtained.

In Embodiment 1, the microcomputer 36 and the input circuit 38 are mounted on the area (in this example, the area at the transverse direction first side Y1 of the arrangement area of the heat sink 11) of the first substrate surface 4, that is not covered by the heat sink 11. The smoothing capacitor 24 is also mounted on the area (in this example, the area at the transverse direction second side Y2 of the arrangement area of the heat sink 11) of the first substrate surface 4, that is not covered by the heat sink 11.

As described above, the radiation subject components, which are the subject electronic components 2 and the subject connection wires 6, are arranged in such a way as to be concentrated as much as possible on the first substrate surface 4 of the substrate 10 and, in addition to that, the protruding heights of the radiation subject components are made to be substantially equal to one another, so that it is made possible to make the portion, of the heat sink 11, that faces the radiation subject components the flat basic plane 31; thus, it is made possible to make the intermediate member 12 have the shape of a single sheet. Accordingly, the respective shapes of the heat sink 11 and the intermediate member 12 can be made simple and easy-to-be-produced. Moreover, it is facilitated to secure the adhesiveness among the intermediate member 12, the subject electronic component, and the heat sink 11; thus, the heat radiation performance can be secured. The adjustment of the thickness of the heat-transfer protruding portion 16 makes it possible to make the respective protruding heights of the subject electronic component 2 and the heat-transfer protruding portion 16 equal to each other; thus, the subject electronic component 2 having an arbitrary protruding height can be accepted.

2. Embodiment 2

Figure 4:
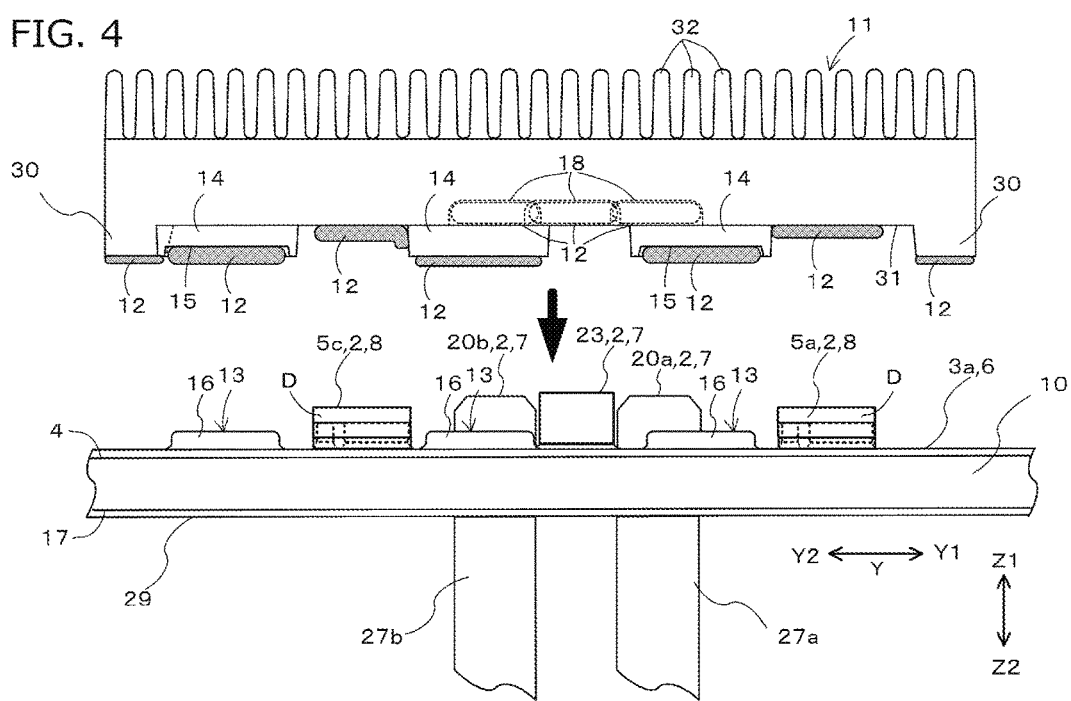
FIG. 4 is a side view of the principal parts of an electronic control unit, when a heat sink according to Embodiment 2 of the present invention is removed from a substrate.

An electronic control unit 1 according to Embodiment 2 will be explained with reference to drawings. The explanation for constituent parts that are the same as those in Embodiment 1 will be omitted. The circuit configuration of the electronic control unit 1 according to Embodiment 2 is the same as that of Embodiment 1 represented in FIG. 1. The arrangement configuration, in a plan view, of the two or more subject electronic components 2, the subject connection wires 6, the heat sink 11, and the like according to Embodiment 2 is the same as that of Embodiment 1 illustrated in FIG. 2. FIG. 4 is an exploded side view of the principal parts of the electronic control unit 1, viewed from the longitudinal direction second side X2, when the heat sink 11 according to Embodiment 2 is removed from the substrate 10 toward the upper side Z1.

In Embodiment 2, unlike Embodiment 1, the intermediate member 12 is divided into two or more sheet-shaped members corresponding to respective radiation subject components. Also in Embodiment 2, a heat-transfer protruding portion 16 protruding toward the heat sink 11 is provided in the connection wire abutting portion 13. However, unlike Embodiment 1, described above, the heat-transfer protruding portion 16 is formed of solder coated on the top surface of the connection wire abutting portion 13. As is the case with foregoing Embodiment 1, the heat-transfer protruding portion 16 is formed in the shape of a flat plate. This configuration makes it possible that in one and the same process in which the microcomputer 36 and the input circuit 38 or the switching device and the shunt resistor 23 are bonded to the substrate 10 through soldering, it is made possible that solder is coated on the top surface of the connection wire abutting portion 13 so as to form the heat-transfer protruding portion 16. In this case, it is made possible that the respective solder thicknesses of the heat-transfer protruding portion 16 and the other components are made to be equal to one another; thus, the process can be simplified. The protruding height of the heat-transfer protruding portion 16 according to Embodiment 2 is smaller than that of the heat-transfer protruding portion 16 according to Embodiment 1. Accordingly, the difference between the protruding height, from the first substrate surface 4, of the connection wire abutting portion 13 (heat-transfer protruding portion 16) and the respective protruding heights, from the first substrate surface 4, of the two or more subject electronic components 2 is larger than that in Embodiment 1. As is the case with foregoing Embodiment 1, the heat-transfer protruding portion 16 may be formed by soldering a copper flat plate to the connection wire abutting portion 13.

In Embodiment 2, unlike foregoing Embodiment 1, the portion, of the heat sink 11, that faces the top surface of the connection wire abutting portion 13 is a protruding portion 14 that protrudes from the basic plane 31 toward the connection wire abutting portion 13 (toward the lower side Z2). This configuration makes it possible that the gap between the connection wire abutting portion 13 and the heat sink 11 is appropriately narrowed by means of the protruding portion 14 so that the thickness of the intermediate member 12 disposed in that gap is adjusted not to become too large; thus, the heat-conductive property and the insulating property can appropriately be secured. Accordingly, the heat of the subject connection wire 6 can efficiently be radiated. Moreover, the protruding portion 14 facilitates the positioning of the intermediate member 12 to be disposed on the basic plane 31 around that protruding portion 14. For example, the positioning can be performed by making the intermediate member 12 that abuts against the maximum heat generating component 8 abut against the circumferential wall of the protruding portion 14. Alternatively, in the case where the intermediate member 12 is coated on the basic plane 31 around the protruding portion 14, the coating thickness of the intermediate member 12 can be adjusted with respect to the circumferential wall of the protruding portion 14.

The protruding portion 14 is formed in the shape of a flat plate having a planar shape (in this example, a planar shape that is wider than that of the heat-transfer protruding portion 16) corresponding to the connection wire abutting portion 13 (the heat-transfer protruding portion 16). A front-end recess portion 15 depressed toward the side opposite to the side of the connection wire abutting portion 13 (toward the upper side Z1) is formed in the front endface of the protruding portion 14; the intermediate member 12 is provided in the front-end recess portion 15. This configuration makes it possible to perform the positioning of the intermediate member 12 by means of the front-end recess portion 15. Also in the case where the intermediate member 12 having a fluidity is coated and then cured on the front endface of the protruding portion 14, the intermediate member 12 having a fluidity can be stored in the front-end recess portion 15; thus, the intermediate member 12 can appropriately be formed.

When it is coated on each of the recess portions, the intermediate member 12 having a fluidity is coated and cured on each of the recess portions opening upward in the vertical direction, while the heat sink 11 is disposed in such a way that the normal direction of the basic plane 31 is oriented upward in the vertical direction.

The planar shape of the front-end recess portion 15 is wider than that of the heat-transfer protruding portion 16. As a result, it is made possible to prevent the edge portion that forms the circumference of the front-end recess portion 15 and protrudes toward the lower side Z2 from making contact with and becoming conductive to the heat-transfer protruding portion 16. The bottom surface of the front-end recess portion 15 is a plane parallel to the first substrate surface 4. The intermediate member 12 is formed in such a way as to protrude from the front-end recess portion 15 toward the lower side Z2. Therefore, it is made possible to prevent the edge portion of the front-end recess portion 15 from making contact with and becoming conductive to the heat-transfer protruding portion 16.

The protruding heights, toward the heat sink 11 (toward the upper side Z1), of the shunt resistor 23 and the motor connection terminals 20a and 20b, which are low-heat generating components 7, are larger than the protruding height of the connection wire abutting portion 13. Then, the portions, of the heat sink 11, that face the respective top surfaces of the shunt resistor 23, the first motor connection terminal 20a, and the second motor connection terminal 20b are recess portions 18 that are depressed from the basic plane 31 toward the side opposite to the side of the low-heat generating components 7 (toward the upper side Z1); the intermediate members 12 are provided in the respective recess portions 18.

This configuration makes it possible that the gap between the heat-generating component having a large protruding height and the heat sink 11 is appropriately widened by means of the recess portion 18 so that the thickness of the intermediate member 12 disposed in that gap is adjusted not to become too small; thus, the insulating property of the intermediate member 12 can appropriately be secured. Moreover, it is made possible to facilitate the positioning of the intermediate member 12 by means of the recess portion 18. Also in the case where the intermediate member 12 having a fluidity is coated and then cured on the bottom side of the heat sink 11, the intermediate member 12 having a fluidity can be stored in the recess portion 18; thus, the intermediate member 12 can appropriately be formed.

The planar shape of each of the recess portions 18 is wider than that of the radiation subject component that faces that recess portion 18. Therefore, it is made possible to prevent the portion, around the recess portion 18, of the basic plane 31 from making contact with and becoming conductive to the radiation subject component. The bottom surface of the recess portion 18 is a plane parallel to the first substrate surface 4.

The protruding heights, toward the heat sink 11, of the shunt resistor 23 and the motor connection terminals 20a and 20b are larger than the protruding heights of the two or more switching devices 5a through 5d, which are the maximum heat generating components 8. The portion, of the heat sink 11, that faces corresponding each of the top surfaces of the two or more switching devices 5a through 5d is part of the basic plane 31.

As described above, the protruding heights from the first substrate surface 4 are increasing in the order of the connection wire abutting portion 13, the two or more switching devices 5a through 5d which are the maximum heat generating components 8, and the shunt resistor 23 and the motor connection terminals 20a and 20b which are low-heat generating components 7. The portion, of the heat sink 11, that faces corresponding each of the connection wire abutting portions 13 is the protruding portion 14 that protrudes from the basic plane 31 of the heat sink 11 toward the lower side Z2; the portion, of the heat sink 11, that faces corresponding each of the two or more switching devices 5a through 5d is part of the basic plane 31 of the heat sink 11; the portion, of the heat sink 11, that faces corresponding each of the shunt resistor 23, the first motor connection terminal 20a, and the second motor connection terminal 20b is the recess portion 18 that is depressed from the basic plane 31 of the heat sink 11 toward the upper side Z1.

Accordingly, in accordance with the protruding height of each of the radiation subject components, a protruding portion or a recess portion is formed in the bottom side of the heat sink 11, so that the respective sizes of the gaps between the radiation subject components and the facing sides of the heat sink 11 can be made to fall within a predetermined range. As a result, the respective thicknesses of the intermediate members 12 that each correspond to the radiation subject components can be made to fall within a predetermine range of thickness with which the heat-conductive property and the insulating property can appropriately be secured; thus, the heat of each of the radiation subject components can satisfactorily be radiated.

Moreover, because the switching device, which is the maximum heat generating component 8, is made to abut against the basic plane 31 of the heat sink 11, through the intermediary of the intermediate member 12, the basic structures of the heat sink 11 and the intermediate member 12 can be designed in such a way that the heat radiation performance and the insulating property of the maximum heat generating component 8 becomes excellent. Furthermore, corresponding to the low-heat generating components 7 whose protruding height is larger than that of the maximum heat generating component 8, the recess portion 18 is formed in the basic plane 31 of the heat sink 11, and corresponding to the connection wire abutting portion 13 whose protruding height is smaller than that of the maximum heat generating component 8, the protruding portion 14 is formed in the basic plane 31 of the heat sink 11, so that the heat radiation performances and the insulating properties of the radiation subject components other than the maximum heat generating components 8 can also be secured in an excellent manner.

Two or more heat radiation fins 32 for increasing the surface area and enhancing the heat radiation performance are provided in the upper part of the heat sink 11. The two or more heat radiation fins 32 are formed in the shape of rectangular flat plates that are spaced apart from one another and parallel to one another. The intermediate member 12 in the shape of a sheet is inserted between the bottom surface of the leg portion 30 and the first substrate surface 4.

3. Embodiment 3

Figure 5:
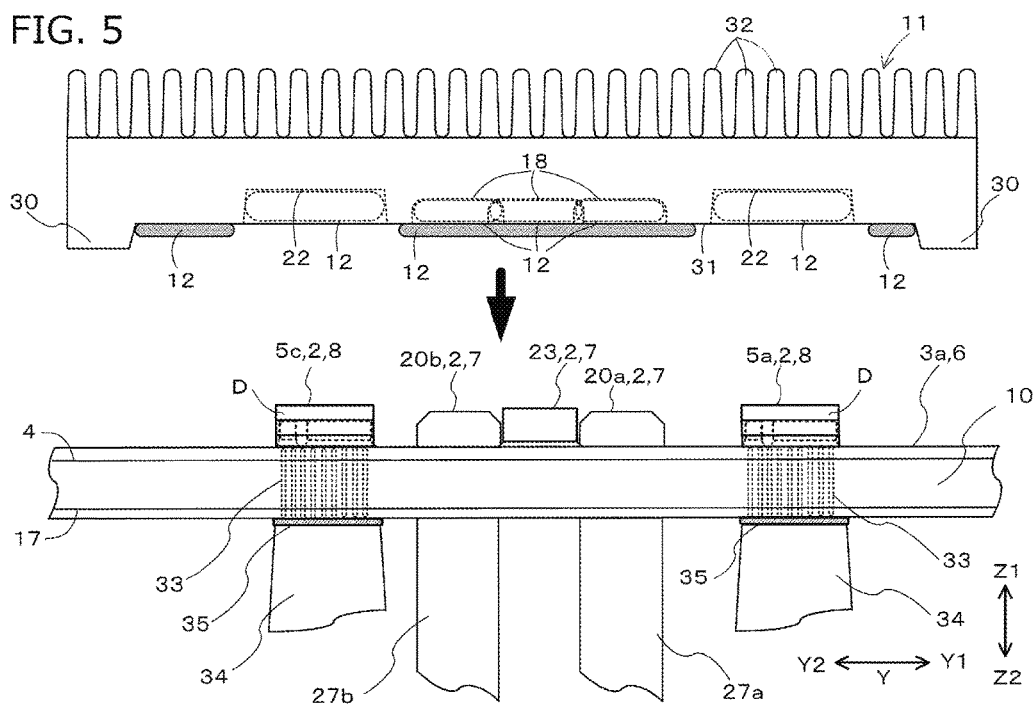
FIG. 5 is a side view of the principal parts of an electronic control unit, when a heat sink according to Embodiment 3 of the present invention is removed from a substrate.

An electronic control unit 1 according to Embodiment 3 will be explained with reference to drawings. The explanation for constituent parts that are the same as those in Embodiment 1 will be omitted. The circuit configuration of the electronic control unit 1 according to Embodiment 3 is the same as that of Embodiment 1 represented in FIG. 1. The arrangement configuration, in a plan view, of the two or more subject electronic components 2, the subject connection wires 6, the heat sink 11, and the like according to Embodiment 3 is the same as that of Embodiment 1 illustrated in FIG. 2. FIG. 5 is an exploded side view of the principal parts of the electronic control unit 1, viewed from the longitudinal direction second side X2, when the heat sink 11 according to Embodiment 3 is removed from the substrate 10 toward the upper side Z1.

Also in Embodiment 3, as is the case with Embodiment 1, the protruding heights, toward the heat sink 11, of the maximum heat generating components 8 (the two or more switching devices 5a through 5d), which are the electronic components that each generate heat most among the two or more subject electronic components 2 when energized, are larger than the protruding heights of the connection wire abutting portions 13. Unlike foregoing Embodiment 1, the portion, of the heat sink 11, that faces the top surface of the connection wire abutting portion 13 is part of the basic plane 31 of the heat sink 11. The portion, of the heat sink 11, that faces the top surface of the maximum heat generating component 8 is a recess portion 22 that is depressed from the basic plane 31 toward the side opposite to the side of the maximum heat generating component 8; the intermediate member 12 is provided in the recess portion 22.

In this configuration, because the portion, of the heat sink 11, that faces the connection wire abutting portion 13 is part of the basic plane 31 and the portion, of the heat sink 11, that faces the maximum heat generating component 8 is the recess portion 22 that is depressed from the basic plane 31, the increase of depressions and protrusions of the heat sink 11 can be suppressed and hence the facilitation in manufacturing the heat sink 11 can be secured. The recess portion 22 makes it possible to securely position the intermediate member 12 against which the maximum heat generating component 8 abuts. Moreover, when the intermediate member 12 having a fluidity is coated and cured on the recess portion 22, the intermediate member 12 having a fluidity can be stored in the recess portion 22; therefore, it is made possible to readily form the intermediate member 12 in the recess portion 22 in such a way that the surface thereof becomes a uniform plane. Accordingly, because the adhesiveness of the intermediate member 12 to the maximum heat generating component 8, which requires heat radiation most, is readily secured, the heat radiation performance of the maximum heat generating component 8 can be secured.

When it is coated on each of the recess portions, the intermediate member 12 having a fluidity is coated and cured on each of the recess portions opening upward in the vertical direction, while the heat sink 11 is disposed in such a way that the normal direction of the basic plane 31 is oriented upward in the vertical direction.

The planar shape of each of the recess portions 22 is wider than that of the maximum heat generating component 8 that faces that recess portion 22. Therefore, it is made possible to prevent the portion, around the recess portion 22, of the basic plane 31 from making contact with and becoming conductive to the maximum heat generating component 8. The bottom surface of the recess portion 22 is a plane parallel to the first substrate surface 4.

Unlike foregoing Embodiments 1 and 2, the heat-transfer protruding portion 16 protruding toward the heat sink 11 is not provided in the connection wire abutting portion 13; the connection wire abutting portion 13 is the portion, of the planar top surface of each of the subject connection wires 6 (the connection wires 3*a* through 3*f*), that abuts against the intermediate member 12. Although no heat-transfer protruding portion 16 is provided in the subject connection wires 6, the thickness of the subject connection wires 6 is larger than that of the subject connection wires 6 in each of foregoing Embodiments 1 and 2. At least one of the intermediate members 12 that abut against the respective connection wire abutting portion 13 is provided in each of the two or more connection wires 3*a* through 3*f*. This configuration makes it possible to insert the sheet-shaped intermediate member 12 between the flat basic plane 31 of the heat sink 11 and the flat top surface of the subject connection wires 6. Accordingly, it is made possible to raise the adhesiveness among the intermediate member 12, the heat sink 11, and the subject connection wire 6; thus, the heat-conductive property can be secured.

It may be allowed that solder-resist processing is not applied to the top surface portion of each of the connection wires 3*a* through 3*f*, as the connection wire abutting portions 13, and copper is exposed. Solder-resist processing is applied to the top surface portion of each of the connection wires 3*a* through 3*f*, excluding the connection wire abutting portion 13 thereof. This configuration can raise the property of heat conduction between the connection wire abutting portion 13 and the intermediate member 12.

The protruding heights, toward the heat sink 11 (toward the upper side Z1), of the shunt resistor 23 and the motor connection terminals 20*a* and 20*b*, which are low-heat generating components 7, are larger than the protruding height of the connection wire abutting portion 13. As is the case with foregoing Embodiment 2, the portions, of the heat sink 11, that face the respective top surfaces of the shunt resistor 23, the first motor connection terminal 20*a*, and the second motor connection terminal 20*b* are recess portions 18 that are depressed from the basic plane 31 toward the side opposite to the side of the low-heat generating components 7 (toward the upper side Z1); the intermediate members 12 are provided in the respective recess portions 18.

As described above, because the portion, of the heat sink 11, that faces the maximum heat generating component 8 is the recess portion 22 and the portion, of the heat sink 11, that faces the subject connection wires 6 is the flat basic plane 31, the heat radiation performances of the maximum heat generating component 8 and the subject connection wires 6 can be raised. The disposal of the intermediate member 12 into the recess portion 22 and the disposal of the intermediate member 12 on the basic plane 31 can be simplified. Also in the case of coating the intermediate member 12 having a fluidity, the intermediate member 12 is filled into the recess portion 22 and then is cured, so that it is made possible to form the intermediate member 12 in the shape of a uniform-thickness sheet. Accordingly, because the adhesiveness of the intermediate member 12 to the maximum heat generating component 8 can be secured, the heat radiation performance of the maximum heat generating component 8, which requires heat radiation most, can be maintained in an excellent manner.

Unlike foregoing Embodiments 1 and 2, two or more through-holes 33 that each penetrate the substrate 10 are formed in each of the portion of the substrate 10 (in this example, the substrate 10 and the connection wire), on which the maximum heat generating component 8 (the switching device) is surface-mounted. Through the intermediary of a sheet-shaped intermediate member 35 having an insulating property and a heat-conductive property, a heat spreader 34 (or a heat sink) abuts against the portion, of the second substrate surface 17, that faces the maximum heat generating component 8 across the substrate 10. Accordingly, it is made possible that the heat generated by the maximum heat generating component 8 is transferred toward the second substrate surface 17 of the substrate 10, by means of the through-hole 33 and the heat spreader 34; thus, the heat radiation performance can be raised.

Other Embodiments

Lastly, other embodiments of the present invention will be explained. Each of the configurations of embodiments to be explained below is not limited to be separately utilized but can be utilized in combination with the configurations of other embodiments as long as no discrepancy occurs.

(1) In each of the foregoing embodiments, as an example, there has been explained the case where the electronic control unit 1 is a control unit for the motor 25 and the maximum heat generating components 8 are two or more switching devices that each perform on/off-switching of electric-power supply from the power source 21 to the motor 25. However, embodiments of the present invention are not limited to the foregoing case. In other words, it may be allowed that the electronic control unit 1 is a control unit for an apparatus other than the motor 25, for example, a step-up or step-down converter, an electric-power-conversion converter for performing conversion between DC electric power and AC electric power, or the like and that the maximum heat generating component 8 is a single or two or more switching devices to be utilized in each of these converters. Alternatively, the maximum heat generating component 8 may be a thyristor, a diode, or the like.

(2) In each of the foregoing embodiments, as an example, there has been explained the case where the electronic control unit 1 is a control unit, for a permanent-magnet DC commutator motor, that is an H-bridge circuit in which two series circuits, each of which consists of two switching devices, are connected in parallel with each other and that is provided with totally four switching devices. However, embodiments of the present invention are not limited to the foregoing case. In other words, it may be allowed that the electronic control unit 1 is a control unit for each of various kinds of motors, that the electronic control unit 1 has an arbitrary number of switching devices, and that the circuit of the electronic control unit 1 is configured with arbitrary switching devices. For example, it may be allowed that the electronic control unit 1 is a half-bridge circuit in which only one series circuit consisting of two switching devices is provided and that has totally two switching devices. Alternatively, it may be allowed that the electronic control unit 1 is an AC-motor control unit that is a bridge circuit in which three series circuits, each of which consists of two switching devices, are connected in parallel with one another and that has totally six switching devices.

(3) In foregoing Embodiment 2, as an example, there has been explained the case where the protruding heights, from the first substrate surface 4, of the connection wire abutting portion 13, the maximum heat generating component 8, and the low-heat generating component 7 are increasing in that order, where the portion, of the heat sink 11, that faces corresponding each of the maximum heat generating components 8 is part of the basic plane 31 of the heat sink 11, where the portion, of the heat sink 11, that faces corresponding each of the connection wire abutting portions 13 is the protruding portion 14 that protrudes from the basic plane 31 of the heat sink 11 toward the lower side Z2, and where the portion, of the heat sink 11, that faces corresponding each of the low-heat generating components 7 is the recess portion 18 that is depressed from the basic plane 31 of the heat sink 11 toward the upper side Z1. However, embodiments of the present invention are not limited to the foregoing case. In other words, it may be allowed that the protruding height, from the first substrate surface 4, of the maximum heat generating component 8 is highest; that the portion, of the heat sink 11, that faces corresponding each of the top surfaces of the maximum heat generating components 8 is part of the basic plane 31 of the heat sink 11; and that the portion, of the heat sink 11, that faces corresponding each of the top surfaces of other radiation subject components is a protruding portion that protrudes from the basic plane 31 of the heat sink 11 toward the lower side Z2, in accordance with the protruding height of corresponding each of the radiation subject components. Alternatively, it may be allowed that the protruding height, from the first substrate surface 4, of the maximum heat generating component 8 is lowest; that the portion, of the heat sink 11, that faces corresponding each of the top surfaces of the maximum heat generating components 8 is part of the basic plane 31 of the heat sink 11; and that the portion, of the heat sink 11 that faces corresponding each of the top surfaces of other radiation subject components is a recess portion that is depressed from the basic plane 31 of the heat sink 11 toward the upper side Z1, in accordance with the protruding height of corresponding each of the radiation subject components.

(4) In foregoing Embodiment 3, as an example, there has been explained the case where a single recess portion 22 faces the top surface of a single maximum heat generating component 8 (switching device). However, embodiments of the present invention are not limited to the foregoing case. That is to say, it may be allowed that the single recess portion 22 is formed in such a way as to face the respective top surfaces of two or more maximum heat generating components 8 and that a single sheet-shaped intermediate member 12 is disposed in a single recess portion 22. For example, it may be allowed that a single recess portion 22 that faces the first switching device 5*a* and the second switching device 5*b*, which are adjacent to each other, is formed and a single sheet-shaped intermediate member 12 is provided in the single recess portion 22. Similarly, it may be allowed that a single recess portion 22 that faces the third switching device 5*c* and the fourth switching device 5*d*, which are adjacent to each other, is formed and a single sheet-shaped intermediate member 12 is provided in the single recess portion 22. Alternatively, it may be allowed that the respective recess portions 22 corresponding to the four switching devices 5*a* through 5*d* communicate with one another and hence a single recess portion 22 having a square U-shaped planar shape is formed and that a single sheet-shaped intermediate member 12 is provided in the single recess portion 22. This configuration makes it possible that the intermediate member 12 having a fluidity is poured into and then cured in a single recess portion 22 so that a single sheet-shaped intermediate member 12 is formed. Because the thicknesses of the sheet-shaped intermediate members 12 formed in the single recess portion 22 are equalized, variations in the radiation of the heat of two or more maximum heat generating components 8 that face the single recess portion 22 can be suppressed; thus the respective temperatures of the two or more maximum heat generating components 8 are equalized.

In the scope of the present invention, the embodiments thereof can freely be combined with one another and can appropriately be modified or omitted.

INDUSTRIAL APPLICABILITY

The present invention can suitably be applied to an electronic control unit provided with electronic components and connection wires mounted on a substrate and a heat sink for radiating heat thereof.

REFERENCE SIGNS LIST

1: electronic control unit
2: subject electronic component (electronic component)
3*a* through 3*f*: connection wires (subject connection wires)
4: first substrate surface
5*a* through 5*d*: switching devices (subject electronic components, maximum heat generating components)
6: subject connection wire (connection wire)
7: low-heat generating component
8: maximum heat generating component
9: control circuit
10: substrate
11: heat sink
12: intermediate member
13: connection wire abutting portion
14: protruding portion
15: front-end recess portion
16: heat-transfer protruding portion
18: recess portion
20*a* and 20*b*: motor connection terminals (subject electronic components, low-heat generating components)
21: power source
22: recess portion
23: shunt resistor (subject electronic component, low-heat generating component)
24: smoothing capacitor
25: motor
30: leg portion
31: basic plane
32: heat radiation fin
Z1: upper side
Z2: lower side

The invention claimed is:

1. An electronic control unit comprising:
two or more electronic components that each generate heat when energized;
connection wires that connect the two or more electronic components; and
a heat sink for radiating heat of the two or more electronic components and the connection wires,
wherein the two or more electronic components and the connection wires are mounted on a first substrate face that is one of the sides of a substrate,
wherein the heat sink is disposed spaced apart from a top surface, of each of the two or more electronic components and the connection wires, that is the surface opposite to the first substrate face,
wherein an intermediate member having an insulating property and a heat-conductive property is provided in a gap between the heat sink, and the two or more electronic components and connection wire abutting portions each of which is at least part of the connection wire in such a way as to abut against the heat sink, and the connection wire abutting portions or the two or more electronic components, and
wherein the top surface of a maximum heat generating component, which is an electronic component that generates heat most among the two or more electronic components when energized, is a plane; a portion, of the heat sink, that faces the top surface of the maximum heat generating component is part of a basic plane, which is a plane of the heat sink, and
wherein the connection wires are provided with connection wire portion each of which is formed in a shape of a flat plate, and provided with the connection wire abutting portion which is provided with a heat-transfer protruding portion that is made of a material of a kind the same as the kind of the connection wire portions or a material having a heat-conductive property substantially the same as that of the connection wire portions, the heat-transfer protruding portion being formed in a shape of a flat plate protruding toward the heat sink from the connection wire portion, the heat-transfer protruding portion abutting against the intermediate member.

2. The electronic control unit according to claim 1,
wherein the portion, of the heat sink, that faces the respective top surfaces of the connection wire abutting portions and the two or more electronic components is part of the basic plane, and
wherein the intermediate member is formed in the shape of a single sheet that abuts against the basic plane and has an elasticity.

3. The electronic control unit according to claim 1,
wherein the maximum heat generating component is one of two or more switching devices that each perform on/off-switching of electric-power supply from a power source to a motor, and
wherein the connection wire is one of two or more connection wires that connect power source connection terminals to be connected with the power source, the two or more switching devices, and motor connection terminals to be connected with the motor.

4. The electronic control unit according to claim 1,
wherein the heat-transfer protruding portion is soldered with the connection wire portion.

5. An electronic control unit comprising:
two or more electronic components that each generate heat when energized;
connection wires that connect the two or more electronic components; and
a heat sink for radiating heat of the two or more electronic components and the connection wires,
wherein the two or more electronic components and the connection wires are mounted on a first substrate surface that is one of the sides of a substrate,
wherein the heat sink is disposed spaced apart from a top surface, of each of the two or more electronic components and the connection wires, that is the surface opposite to the first substrate surface,
wherein an intermediate member having an insulating property and a heat-conductive property is provided in a gap between the heat sink, and the two or more electronic components and connection wire abutting portions each of which is at least part of the connection wire in such a way as to abut against the heat sink, and the connection wire abutting portions or the two or more electronic components,
wherein the top surface of a maximum heat generating component, which is an electronic energized, is a plane; a portion, of the heat sink, that faces the top surface of the maximum heat generating, component is part of a basic plane, which is a plane of the heat sink,
wherein the portion, of the heat sink, that faces the top surface of the connection wire abutting portion is a protruding portion that protrudes from the basic plain toward the connection wire abutting portion, and
wherein a front-end recess portion depressed toward the side opposite to the side of the connection wire abutting portion is formed in the front endface of the protruding portion; the intermediate member is provided in the front-end recess portion.

6. The electronic control unit according to claim 5,
wherein the protruding height, toward the heat sink, of a low-heat generating component, which is an electronic component that generates lower heat when energized than the maximum heat generating component generates among the two or more electronic components, is larger than the protruding height of the connection wire abutting portion, and
wherein the portion, of the heat sink, that faces the top surface of the low-heat generating component is a recess portion that is depressed from the basic plane toward the side opposite to the side of the low-heat generating component; the intermediate member is provided in the recess portion.

7. The electronic control unit according to claim 5,
wherein the connection wires are provided with connection wire portions each of which is formed in a shape of a flat plate, and provided with the connection wire abutting portion which is provided with a heat-transfer protruding portion that is made of a material of a kind the same as the kind of the connection wire portions or a material having a heat-conductive property substantially the same as that of the connection wire portions, the heat-transfer protruding portion being formed in a shape of a flat plate protruding toward the heat sink from the connection wire portion, the heat-transfer protruding portion abutting against the intermediate member.

8. The electronic control unit according to claim 7,
wherein the heat-transfer protruding portion is soldered with the connection wire portion.

9. The electronic control unit according to claim 5,
wherein the maximum heat generating component is one of two or more switching devices that each perform on/off-switching of electric-power supply from a power source to a motor, and
wherein the connection wire is one of two or more connection wires that connect power source connection terminals to be connected with the power source, the two or more switching devices, and motor connection terminals to be connected with the motor.

* * * * *